United States Patent [19]

Hill

[11] Patent Number: 5,298,438

[45] Date of Patent: Mar. 29, 1994

[54] METHOD OF REDUCING EXTRINSIC BASE-COLLECTOR CAPACITANCE IN BIPOLAR TRANSISTORS

[75] Inventor: Darrell G. Hill, Plano, Tex.

[73] Assignee: Texas Instruments Incorporated, Dallas, Tex.

[21] Appl. No.: 938,190

[22] Filed: Aug. 31, 1992

[51] Int. Cl.[5] .......................................... H01L 21/265
[52] U.S. Cl. ......................................... 437/31; 437/7;
    437/126; 437/133; 437/909; 148/DIG. 10;
    148/DIG. 72
[58] Field of Search ................. 437/31, 126, 133, 228,
    437/7, 909; 148/DIG. 9, DIG. 10, DIG. 72

[56] References Cited

U.S. PATENT DOCUMENTS 5,024,958  6/1991  Awano .................................. 437/31

OTHER PUBLICATIONS

High-Performance AlGaAs/GaAs HBT's Utilizing Proton-Implanted Buried Layers and Highly Doped Base Layers, Osaake Nakajima, et al. IEEE Transactions on Electron Devices, vol. ED-34, No. 12, Dec. 1987, pp. 2393-2398.

Primary Examiner—Brian E. Hearn
Assistant Examiner—Tuan Nguyen
Attorney, Agent, or Firm—Richard A. Stoltz; Richard L. Donaldson; William E. Hiller

[57] ABSTRACT

This is a method of fabricating a heterojunction bipolar transistor on a wafer. The method can comprise: forming a doped subcollector layer 31 on a semiconducting substrate 30; forming a doped collector layer 32 on top of the collector layer, the collector layer doped same conductivity type as the subcollector layer; forming a doped base epilayer 34 on top of the collector layer, the base epilayer doped conductivity type opposite of the collector layer; forming a doped emitter epilayer 36, the emitter epilayer doped conductivity type opposite of the base layer to form the bipolar transistor; forming a doped emitter cap layer 37 on top of the emitter epilayer, the emitter cap layer doped same conductivity as the emitter epilayer; forming an emitter contact 38 on top of the emitter cap layer; forming a base contact on top of the base layer; forming a collector contact on top of the collector layer; and selective etching the collector layer to produce an undercut 45 beneath the base layer.

6 Claims, 8 Drawing Sheets

METHOD OF REDUCING EXTRINSIC BASE-COLLECTOR CAPACITANCE IN BIPOLAR TRANSISTORS

FIELD OF THE INVENTION

This invention generally relates to reducing extrinsic base-collector capacitance in bipolar transistors.

BACKGROUND OF THE INVENTION

Without limiting the scope of the invention, its background is described in connection with the manufacturing of bipolar transistors, as an example.

Heretofore, in this field, in bipolar mesa transistors, the base layer extends outside the area of the active device region to enable contacting of the base. This area is called the extrinsic base region, outside the active device region, and it increases the junction capacitance between the base layer and the layer beneath the base (e.g. the collector, in emitter-up devices).

Since junction capacitance limits the high-frequency performance of bipolar transistors, great effort has been spent on reducing the junction capacitance between the base layer and the layer beneath the base. Accordingly, improvements which overcome any or all of the problems are presently desirable.

SUMMARY OF THE INVENTION

It is herein recognized that a need exists for a method to manufacture a bipolar transistor which reduces the junction capacitance between the base layer and the layer beneath the base. The present invention is directed towards meeting that need.

Generally, and in one form of the invention, during device fabrication, the layer beneath the base is etched laterally; a selective etch is used so that the base layer itself is not significantly affected. The area of the junction between the base and the underlying layer can be significantly reduced.

The selective etching can be accomplished in at least two ways: by including an epitaxial layer in the layer beneath the base which can be selectively removed during fabrication; or by using a doping-selective etch which, for NPN transistors, removes only N-type material but not P-type material (or vice versa for PNP transistors).

Previous partial solutions include minimization of the base contact area and ion bombardment of the extrinsic base region.

Minimization of the base contact area involves a design tradeoff between base resistance (which improves with increasing contact area) and junction capacitance (which degrades with increasing contact area). In contrast, the invention makes the junction capacitance almost independent of base contact area.

Ion bombardment reduces the effective doping density of the layer beneath the base in the extrinsic base region. At best, this approach insures that the layer is depleted of free carriers, so that the dielectric thickness is increased. For example, in the case of a conventional emitter-up AlGaAs/GaAs heterojunction bipolar transistor, if ion bombardment is used in the extrinsic base region, then the capacitance C per unit area in this region is determined by the collector thickness t and the dielectric contact of collector material (e.g. GaAs):

$$C = \epsilon_{GaAs}/t$$

In contrast, if the current solution is applied to the heterojunction bipolar transistor, the capacitance per unit area in the region is no greater than $$C = \epsilon_{air}/d$$

where d is the vertical thickness of the undercut layer and $\epsilon_{air}$ is the dielectric constant of air. Since $\epsilon_{GaAs}/\epsilon_{air} \sim 13$ (and the entire collector layer may be undercut if desired, so that d=t), the capacitance reduction improvement, compared to the ion bombardment approach, is considerably greater.

An additional advantage of the invention is the improvement of the current gain and base resistance compared to the ion bombardment approach. For emitter-up structures, current gains is improved somewhat because the minority carrier lifetime in the extrinsic base is not degraded. Base resistance is improved because the base layer does not undergo ion bombardment. Also, since the junction capacitances are not significantly affected by base contact area, the contact area can be increased to further reduce base resistance.

This invention would be of great use in, although not limited to, microwave amplification or oscillator applications requiring Heterojunction bipolar transistors (HBT) devices to operate above 20 GHz, since conventional HBTs are usually sufficient at lower frequencies.

This is a method of fabricating a heterojunction bipolar transistor on a wafer. This method can comprise: forming a doped subcollector layer on a substrate; forming a doped collector layer on top of the subcollector layer, the collector layer being doped same conductivity type as the subcollector layer; forming a doped base epilayer on top of the collector layer, the base epilayer being doped conductivity type opposite of the collector layer; forming a doped emitter epilayer, the emitter epilayer being doped conductivity type opposite of the base layer to form the bipolar transistor; forming a doped emitter cap layer on top of the emitter epilayer, the emitter cap layer being doped same conductivity as the emitter epilayer; forming an emitter contact on top of the emitter cap layer; etching of the emitter and emitter cap layers to expose the base layer; forming a base contact on top of the base layer; etching of the base y and collector layer to expose the subcollector; selective etching a portion of the collector layer to produce an undercut beneath the base layer; and forming a collector contact on top of the subcollector layer.

Preferably, the collector layer is composed of or contains an AlGaAs layer and the subcollector layer is composed of GaAs and the AlGaAs collector layer is selectively etched to produce the undercut region beneath the base layer.

In one embodiment, the base layer, the emitter layer, and the collector layer (all of which may be epilayer) are composed of silicon.

BRIEF DESCRIPTION OF THE DRAWINGS

The drawings are schematic and the vertical has been exaggerated for clarity.

DETAILED DESCRIPTION OF THE DRAWINGS

The first preferred embodiment method for fabricating bipolar transistors includes the following steps as illustrated in cross sectional elevation views in FIGS. 1-10.

Figure 1:
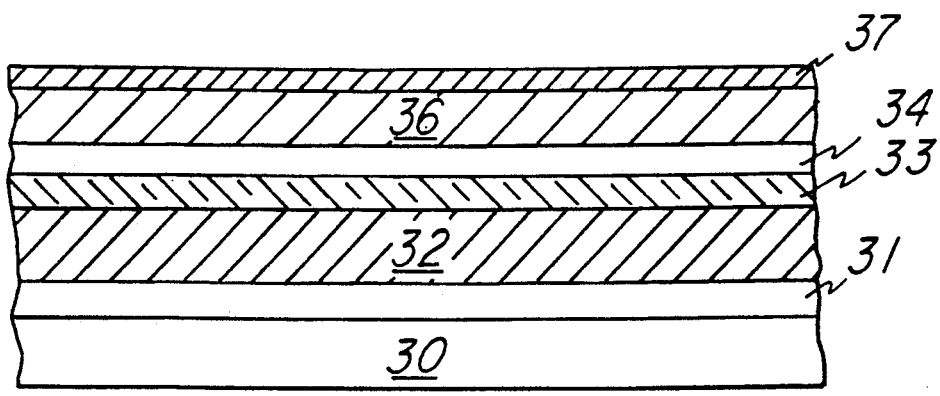
FIGS. 1-10 are cross sectional elevation views of the first preferred embodiment and the steps of the preferred embodiment fabrication method.

In FIG. 1, a substrate material 30 is composed of a semiconductor material, such as GaAs. A GaAs subcollector layer 31 is grown by, for example molecular beam epitaxy, with n-type doping of $3 \times 10^{18}$ cm$^{-3}$ Si and thickness of 500 nm. A collector layer is grown consisting of 500 nm doped n-type at $3 \times 10^{16}$ cm$^{-3}$. The collector layer is composed of AlGaAs layer 32 and an optional GaAs layer 33. A base epilayer 34 of GaAs is deposited on to the collector 32 at a thickness of 50 nm and doped with C at a concentration of $5 \times 10^{19}$ cm$^{-3}$. Emitter epilayer 36 of n-type AlGaAs is deposited onto base layer 34 at a thickness of 50 nm and doping of $2 \times 10^{17}$ cm$^{-3}$. A GaAs emitter cap layer 37 is then deposited with thickness of 300 nm and doping of $5 \times 10^{18}$ cm$^{-3}$.

Figure 2:
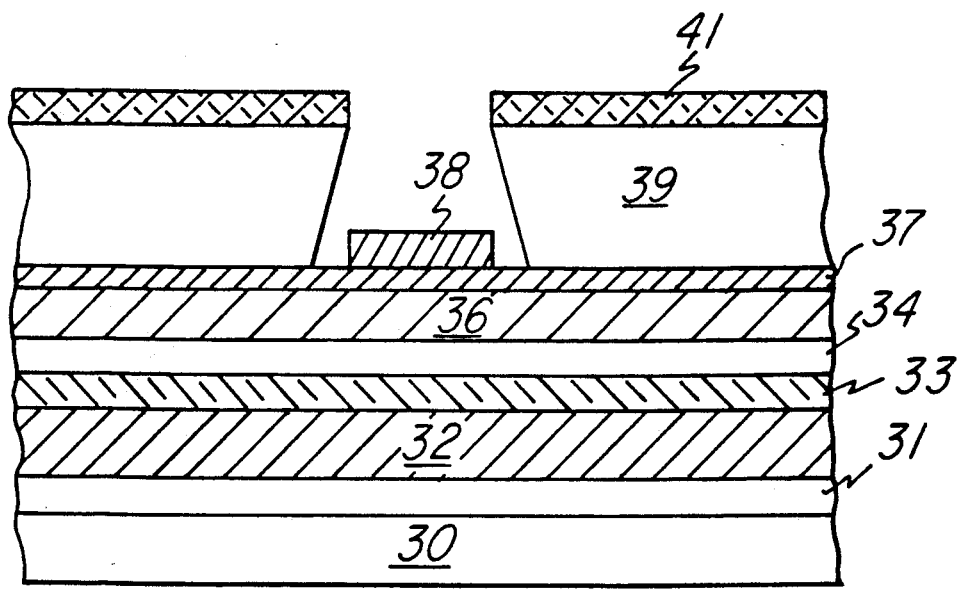

In FIG. 2, photoresist 39 is applied and patterned by lithography. Emitter contact metal 38 is then evaporated, consisting of 50 nm AuGe, 14 nm Ni, and 200 nm Au. The excess metal 41 on top of the photoresist 39 is then lifted off by dissolving the photoresist in acetone.

Figure 3:
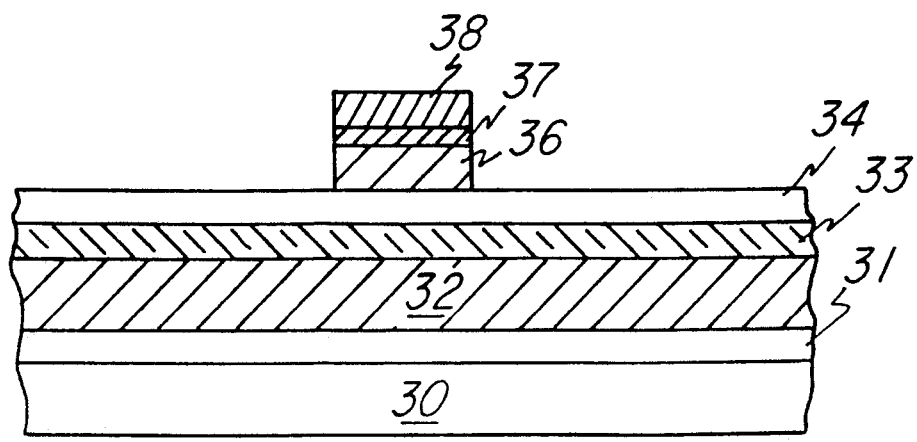

In FIG. 3, the emitter cap 37 and the emitter layer 36 are etched using the emitter contact 38 as a mask.

Figure 4:
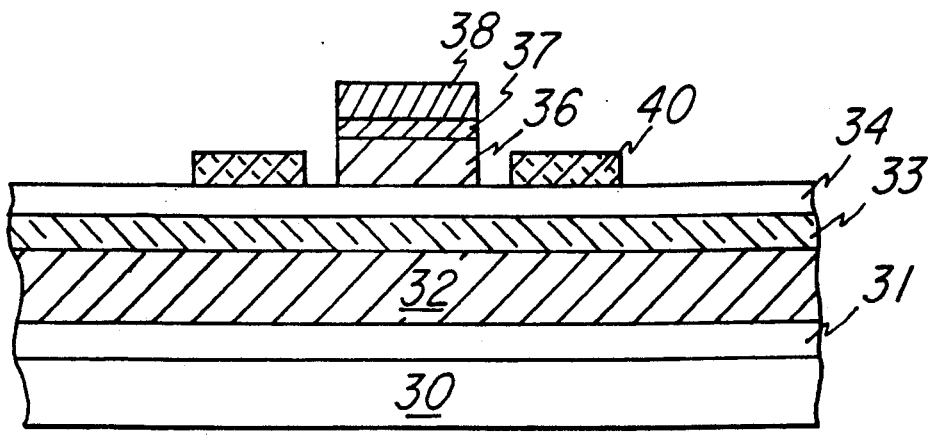

In FIG. 4, the base contacts 40 are evaporated onto the base layer 34 using a lift-off process. The base contact metal consists of 50 nm Ti, 25 nm Pt, and 200 nm Au.

Figure 5:
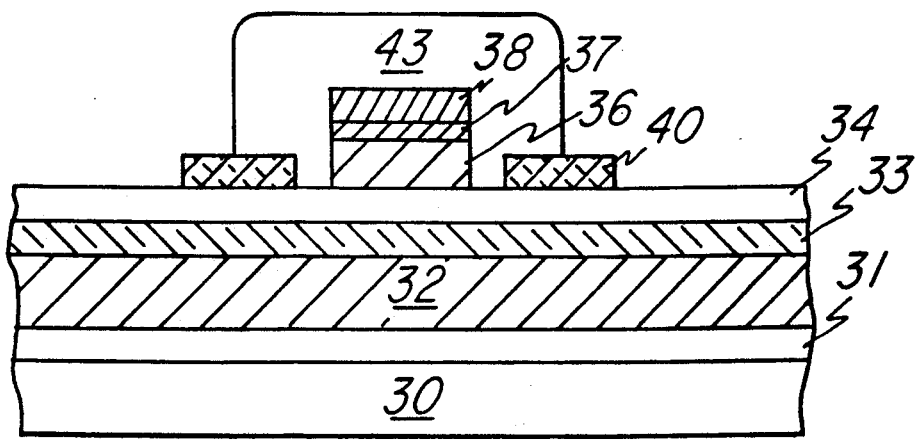

In FIG. 5, a layer of photoresist 43 is deposited and patterned over the emitter and portions of the base contacts.

Figure 6:
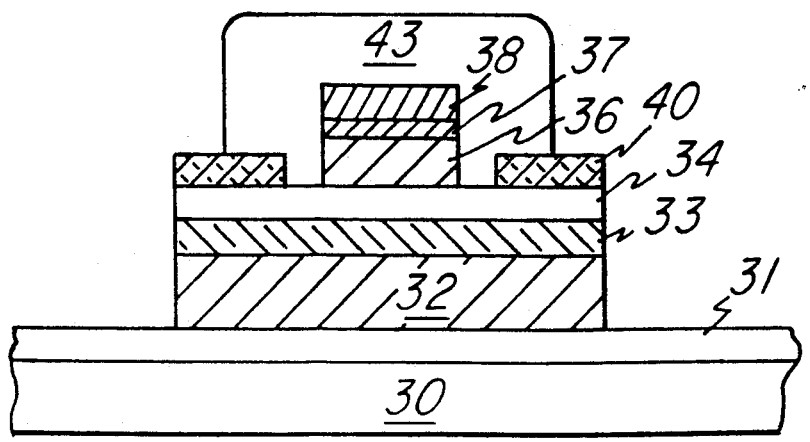

In FIG. 6, the base layer 34 and the collector layers 32 and 33 are etched using the base contact 40 and photoresist 43 as a mask.

Figure 7:
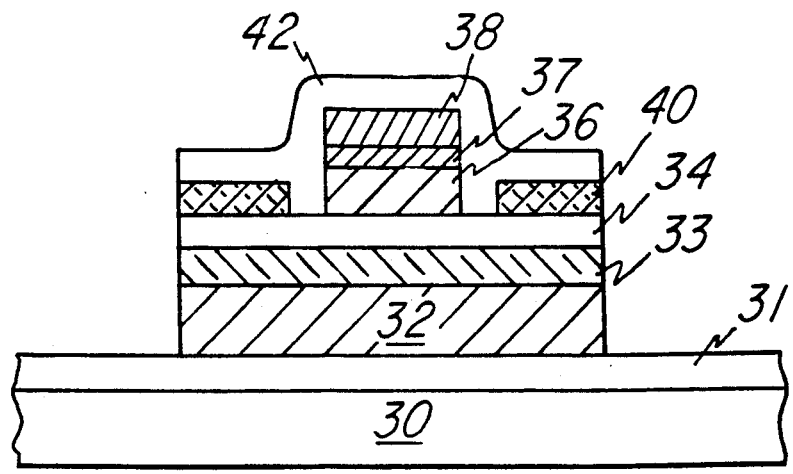

In FIG. 7, a layer of silicon nitride is deposited over the base contact 40, the emitter 36 and the emitter contact 38 to protect the AlGaAs in the emitter.

Figure 8:
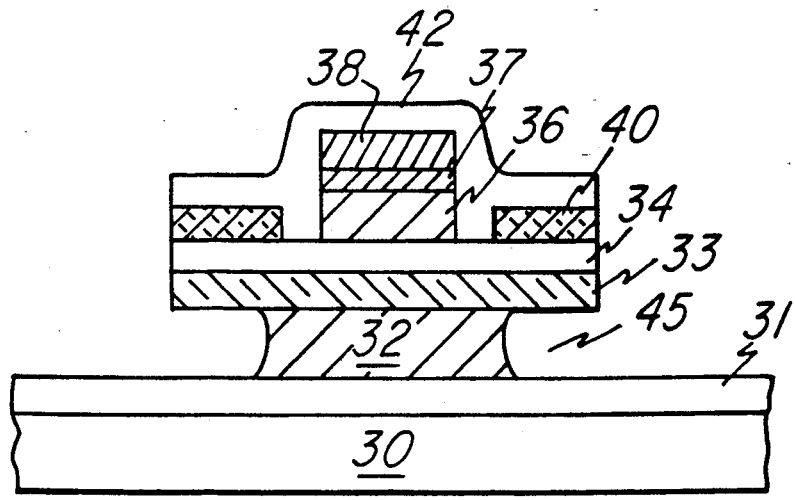

In FIG. 8, a timed selective etch is used to etch the AlGaAs of the collector layer 32 and produce an undercut 45 beneath the base layer 34.

Figure 9:
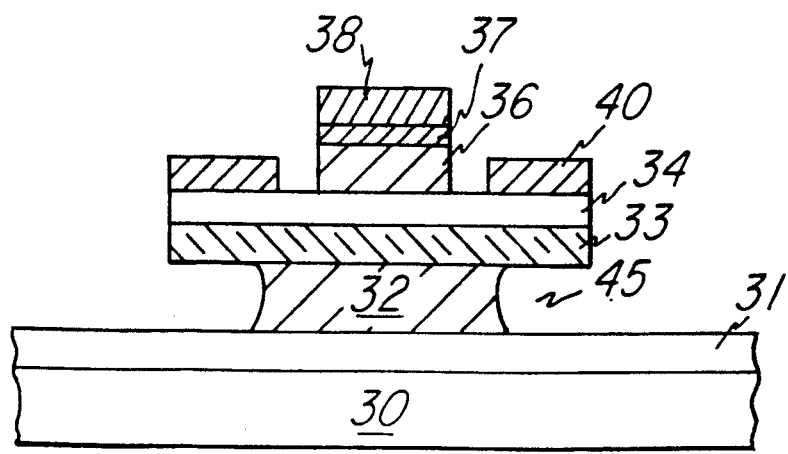

In FIG. 9, the layer of silicon nitride is removed.

Figure 10:
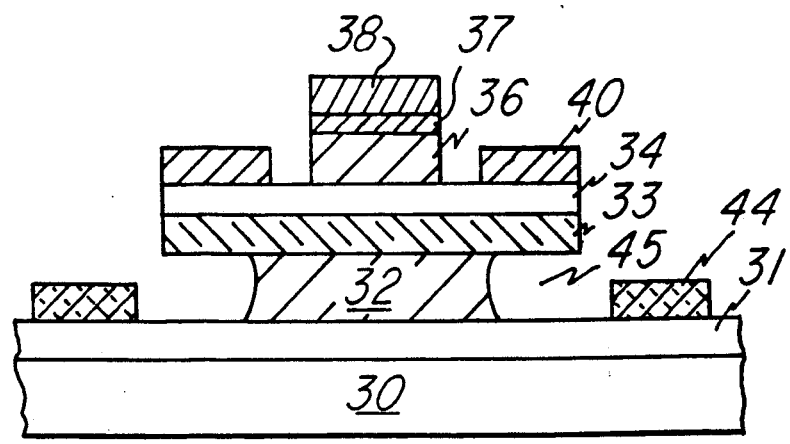

In FIG. 10, 50 nm thick AuGe emitter ohmic contact metal, followed by 14 nm Ni and 200 nm Au layers are evaporated onto the subcollector 31 using a lift-off process to make the collector contact 44. The contacts are then alloyed by heating to 430 degrees Celsius for 1 minute.

The second preferred embodiment method for fabricating high power heterojunction bipolar transistors (HBTs) includes the following steps as illustrated in cross sectional elevation views in FIGS. 11-22. In the second preferred embodiment, ion implantation is used to convert the upper portion of the collector in the extrinsic base region to the doping type of the base to reduce the extrinsic base resistance. The base-collector capacitance is not affected by this implant, because the implanted material is separated from the collector by the air gap produced by the undercut etch.

The fabrication of the second preferred embodiment is similar to that of the first embodiment, except that after the etch to the base and before forming the base contacts, dopant is introduced to the extrinsic base region by diffusion or ion implantation. The emitter metal or photoresist may be used to protect the active device region under the emitter contact.

Figure 11:
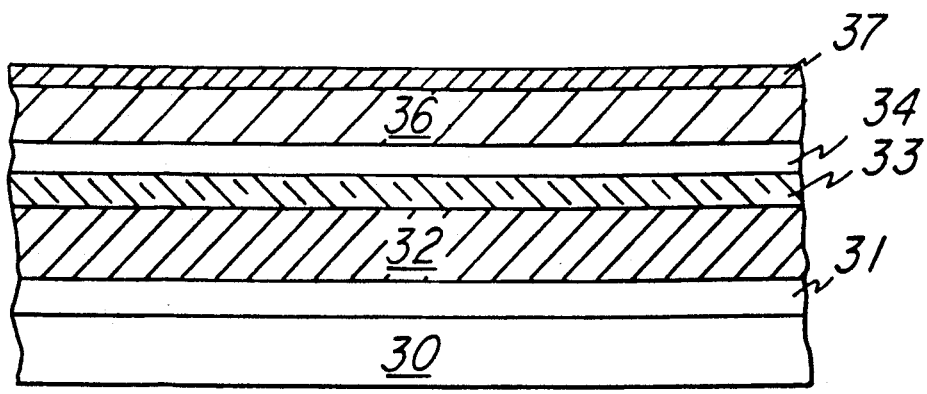

In FIG. 11, a substrate material 30 is composed of a semiconductor material, such as GaAs. A GaAs subcollector layer 31 is grown by, for example molecular beam epitaxy, with n-type doping of $3 \times 10^{18}$ cm$^{-3}$ Si and thickness of 500 nm. A collector layer is grown consisting of 500 nm doped n-type at $3 \times 10^{16}$ cm$^{-3}$. The collector layer is composed of AlGaAs layer 32 and an optional GaAs layer 33. A base epilayer 34 of GaAs is deposited on to the collector 32 at a thickness of 50 nm and doped with C at a concentration of $5 \times 10^{19}$ cm$^{-3}$. Emitter epilayer 36 of n-type AlGaAs is deposited onto base layer 34 at a thickness of 50 nm and doping of $2 \times 10^{17}$ cm$^{-3}$. A GaAs emitter cap layer 37 is then deposited with thickness of 300 nm and doping of $5 \times 10^{18}$ cm$^{-3}$.

Figure 12:
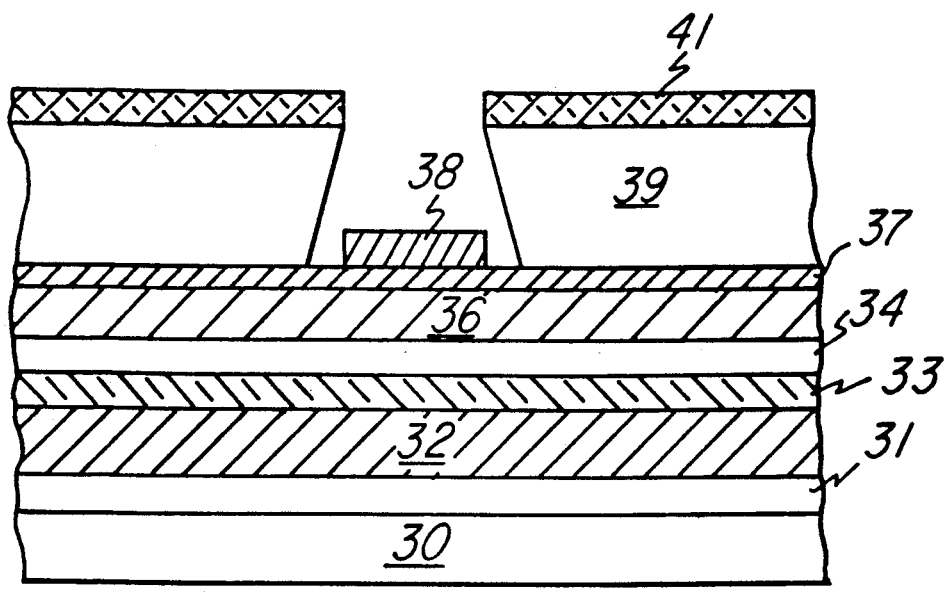

In FIG. 12, photoresist 39 is applied and patterned by lithography. Emitter contact metal 38 is then deposited, consisting of a refractory metal, such as 200 nm WSi. The excess metal 41 on top of the photoresist 39 is then lifted off by dissolving the photoresist in acetone.

Figure 13:
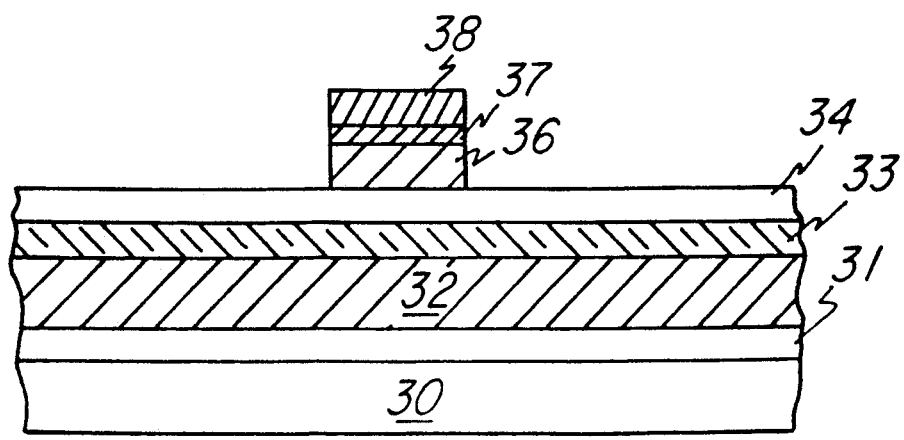

In FIG. 13, the emitter cap 37 and the emitter layer 36 are etched using the emitter contact 38 as a mask.

Figure 14:
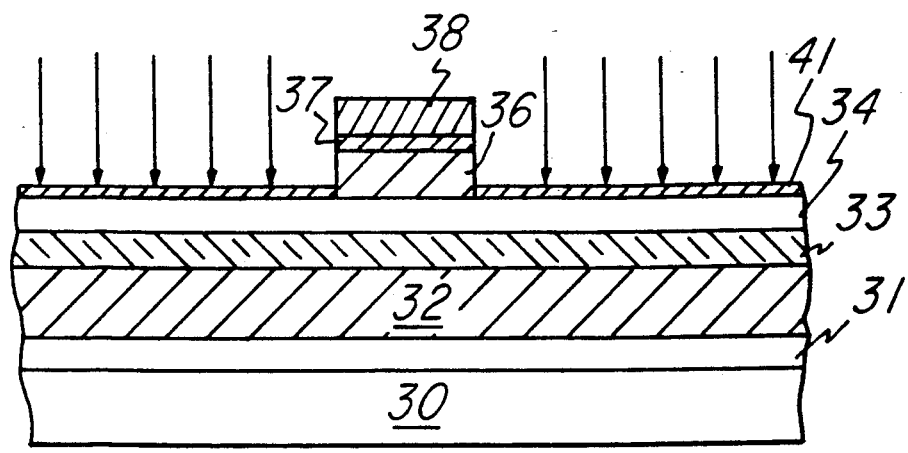
FIGS. 11-22 are cross sectional elevation views of the second preferred embodiment and the steps of the second preferred embodiment fabrication method.

In FIG. 14, 40 nm of silicon nitride 41 is deposited on top of the base layer 34. The structure is then ion implanted (for example, Be at 60 keV to a dose of $1 \times 10^{14}$ cm$^{-2}$) to convert the collector layer 33 immediately under the base layer in the extrinsic base region. The emitter acts as a mask. The structure is then annealed at 800 C. for 30 seconds to activate the implant.

Figure 15:
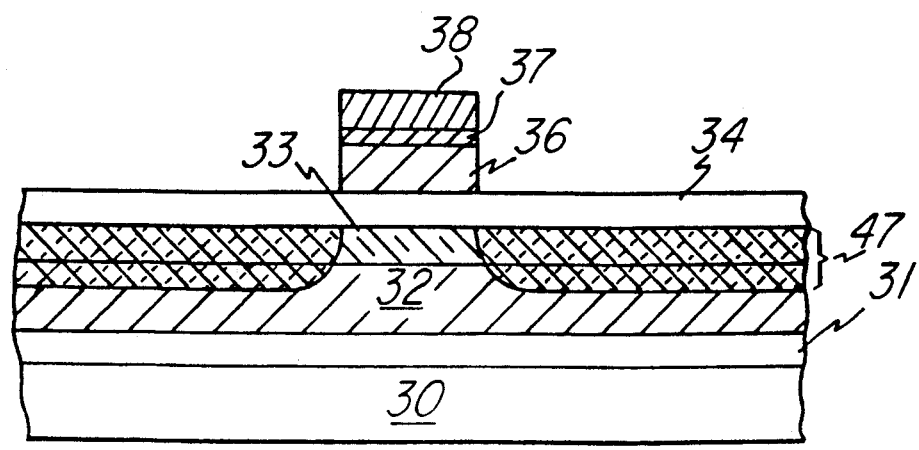

In FIG. 15, the silicon nitride is then removed to leave a ion-implanted portion 47 of the collector layer. The implanted region may extend through the GaAs collector layer 33 and partially into the AlGaAs collector layer 32.

Figure 16:
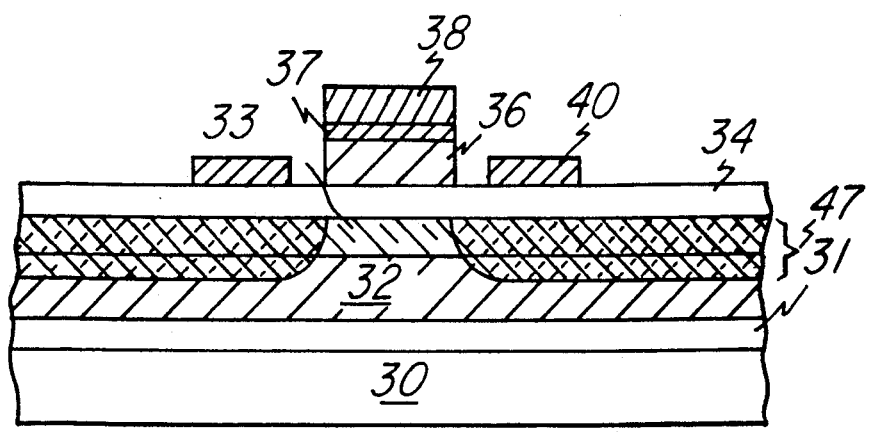

In FIG. 16, the base contacts 40 are evaporated onto the base layer 34 using a lift-off process. The base contact metal consists of 50 nm Ti, 25 nm Pt, and 200 nm Au.

Figure 17:
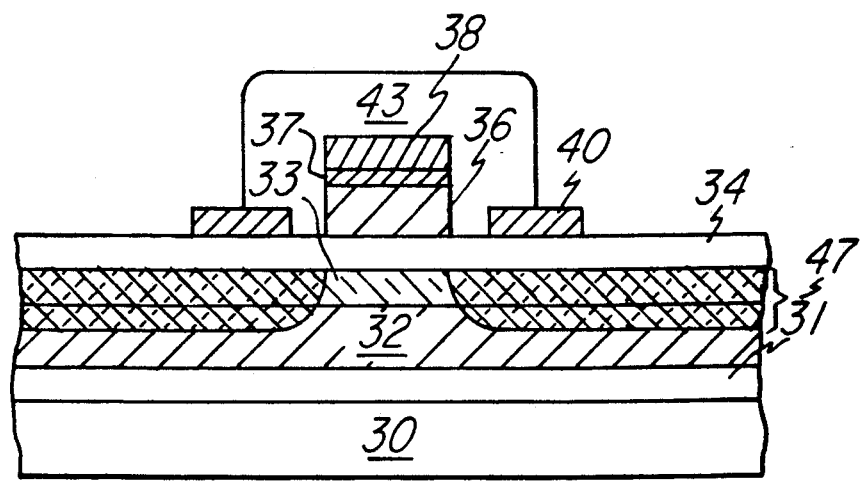

In FIG. 17, a layer of photoresist 43 is deposited and patterned over the emitter and portions of the base contacts.

Figure 18:
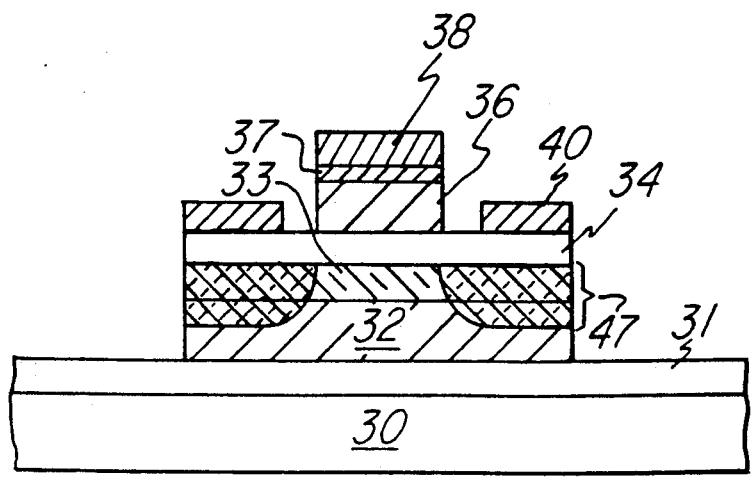

In FIG. 18, the base layer 34 and the collector layers 32 and 33 are etched using the base contact 40 and photoresist 43 as a mask.

Figure 19:
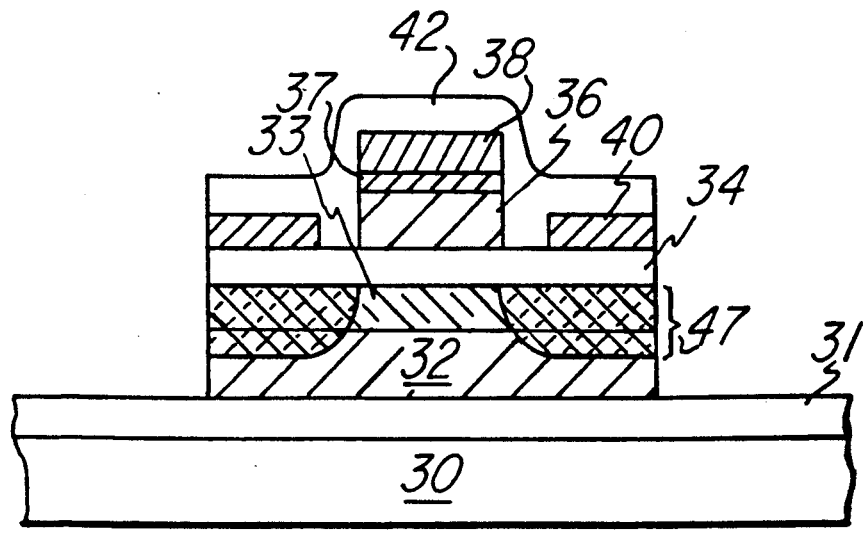

In FIG. 19, a layer of silicon nitride is deposited over the base contact 40, the emitter 36 and the emitter contact 38 to protect the AlGaAs in the emitter.

Figure 20:
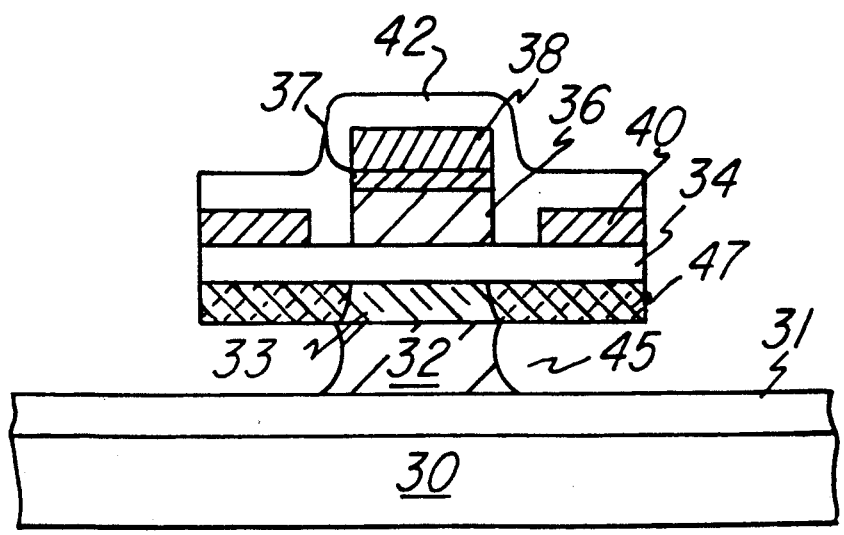

In FIG. 20, a timed selective etch is used to etch the collector layer 32 and produce an undercut 45 beneath the base layer 34. The selective etch may be either dopant selective or material selective.

Figure 21:
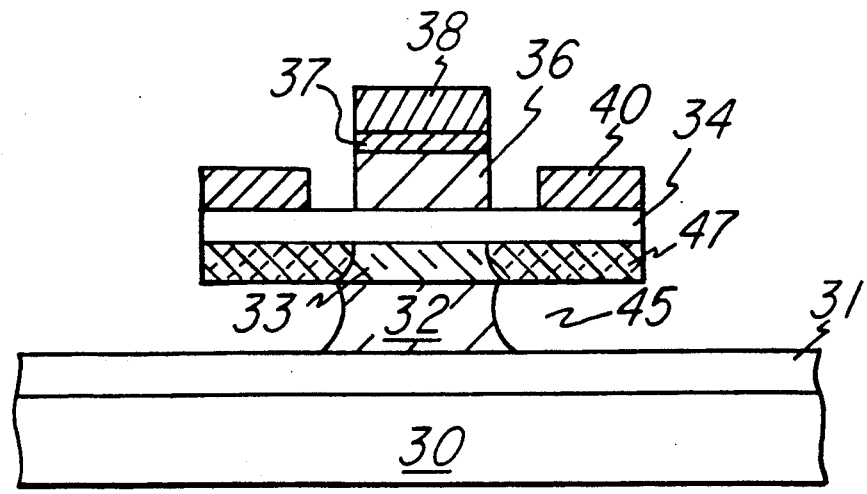

In FIG. 21, the layer of silicon nitride is removed.

Figure 22:
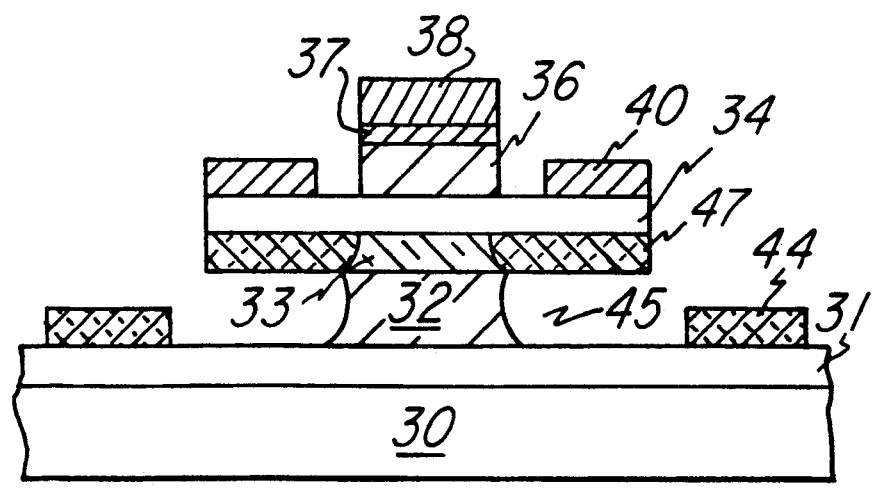

In FIG. 22, 50 nm thick AuGe emitter ohmic contact metal, followed by 14 nm Ni and 200 nm Au layers are evaporated onto the subcollector 31 using a lift-off process to make the collector contact 44. The contacts are then alloyed by heating to 430 degrees Celsius for 1 minute.

What is claimed is:

1. A method of fabricating a bipolar transistor comprising:
   a. forming a doped collector layer on a substrate;
   b. forming a doped base layer on top of said collector layer, said base layer doped conductivity type opposite of said collector layer;

c. forming a doped emitter layer, said emitter layer doped conductivity type opposite of said base layer to form said bipolar transistor;

d. forming an emitter contact on top of said emitter layer;

e. forming a base contact on top of said base layer;

f. forming a collector contact on top of said collector layer; and g. etching said collector layer to produce an undercut beneath portions of said base layer, wherein said etching is conductivity type selective etching.

2. The method of claim 1, wherein portions of said collector layer directly underneath said base layer has same conductivity type as base layer and said etch undercuts said collector layer which is opposite conductivity type as said base layer.

3. The method of claim 1, wherein said base layer, said emitter layer, and said collector layer are composed of silicon.

4. A method of fabricating a bipolar transistor comprising:

a. forming a doped subcollector layer on a substrate;

b. forming a doped collector layer on top of said collector layer, said collector layer doped same conductivity type as said subcollector layer;

c. forming a doped base epilayer on top of said collector layer, said base epilayer doped conductivity type opposite of said collector layer;

d. forming a doped emitter epilayer, said emitter epilayer doped conductivity type opposite of said base epilayer to form said bipolar transistor;

e. forming an doped emitter cap layer on top of said emitter epilayer, said emitter cap layer doped same conductivity as said emitter epilayer;

f. forming an emitter contact on top of said emitter cap layer;

g. forming a base contact on top of said base layer;

h. forming a collector contact on top of said subcollector layer; and i. selective etching said collector layer to produce an undercut beneath said base layer, wherein said selective etching is conductivity type selective.

5. The method of claim 4, wherein portions of said collector layer directly underneath said base layer has same conductivity type as base layer and said etch undercuts said collector layer which is opposite conductivity type as said base layer.

6. The method of claim 4, wherein said base epilayer, said emitter epilayer, and said collector layer are composed of silicon.

* * * * *